US008198793B2

(12) United States Patent
Tung et al.

(10) Patent No.: US 8,198,793 B2
(45) Date of Patent: Jun. 12, 2012

(54) CATHODE DISCHARGE APPARATUS

(75) Inventors: Fu-Ching Tung, Hsinchu (TW);
Tean-Mu Shen, Hsinchu (TW);
Jung-Chen Ho, Hsinchu (TW);
Pei-Shan Wu, Sanchong (TW);
Chia-Ming Chen, Jhubei (TW);
Kuan-Chou Chen, Hsinchu (TW);
Jung-Chen Chien, Jhubei (TW);
Muh-Wang Liang, Toufen Township, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 265 days.

(21) Appl. No.: 12/411,797

(22) Filed: Mar. 26, 2009

(65) Prior Publication Data
US 2010/0123381 A1 May 20, 2010

(30) Foreign Application Priority Data
Nov. 19, 2008 (TW) .............................. 97144774 A

(51) Int. Cl.
*H01J 17/26* (2006.01)
(52) U.S. Cl. .......... 313/231.31; 313/231.01; 313/231.41
(58) Field of Classification Search ............. 313/231.01, 313/231.31, 231.41, 231.51, 231.61
See application file for complete search history.

(56) References Cited

U.S. PATENT DOCUMENTS

| 6,815,900 | B2 * | 11/2004 | Ahmad et al. | 315/111.21 |
| 7,541,604 | B2 * | 6/2009 | Goetze et al. | 250/504 R |
| 2004/0071267 | A1 * | 4/2004 | Jacob et al. | 378/119 |
| 2004/0145292 | A1 * | 7/2004 | Ahmad et al. | 313/231.31 |
| 2006/0273732 | A1 * | 12/2006 | Korobochko et al. | 315/111.21 |
| 2007/0114946 | A1 * | 5/2007 | Goetze et al. | 315/111.21 |
| 2007/0241290 | A1 * | 10/2007 | Zhurin | 250/492.3 |

FOREIGN PATENT DOCUMENTS
CN 1011925 6/2008
EP 1253621 10/2002
* cited by examiner

*Primary Examiner* — Bumsuk Won
(74) *Attorney, Agent, or Firm* — Allen, Dyer, Doppelt, Milbrath & Gilchrist, P.A.

(57) ABSTRACT

A cathode discharge device is provided. The cathode discharge apparatus includes an anode, a cathode and plural cathode chambers. The cathode is located inside the anode, where the cathode has plural flow channels and at least one flow channel hole, and the plural flow channels are connected to one another through the flow channel hole. The plural cathode chambers are located inside the cathode, wherein each of the cathode chambers has a chamber outlet and a chamber inlet connected with at least one of the flow channels.

19 Claims, 7 Drawing Sheets

CATHODE DISCHARGE APPARATUS

FIELD OF THE INVENTION

The present invention relates to a cathode discharge apparatus, especially to a hollow cathode discharge apparatus for the large area coating.

BACKGROUND OF THE INVENTION

Under the condition of the predictable shortage of the fossil fuel in the near future, looking for the substituted energies becomes an urgent issue. Among various substituted energies, the solar energy is the one with the best economy and environment protection. Therefore, several countries, such as USA and Germany, have included the solar energy as the national energy development project. However, the utilization rate of the solar energy is limited due to the conversion efficiency of the solar cell. There are two ways to raise the utilization rate. One is to raise the conversion efficiency of the solar cell, and the other is to reduce the production cost of the solar cell. Nevertheless, it is not easy to raise the conversion efficiency of the solar cell owing to the solid state properties of the semiconductor, but it is feasible to enlarge the exposure area of the solar cell.

The main manufacturing method of the thin film solar cell includes plasma enhanced chemical vapor deposition (PECVD). Since the size of the glass oft he buildings in the metropolis becomes larger, the manufacturing processes of the thin film solar cell for these glass substrates with large sizes have the trend toward the enlarged size and the continuous manufacturing. This trend meets the generation evolution of the substrate size of the thin film transistor liquid crystal display (TFT-LCD). Recently, the great progresses have been being made for the optoelectronic technologies, e.g. solar cells, TFT-LCD, etc., which necessitate the plasma apparatuses capable of performing the large area continuous manufacturing processes. Currently, the plasma apparatuses have the uniformity problem for the large-size plasma processes applied to TFT-LCD, thin film solar cells, etc.

In order to eliminate the above problem, the new technical solutions are proposed in the present invention by introducing the newly developed plasma hollow cathode discharge apparatus for the large area deposition processes for optoelectronic devices, e.g. solar cells. By stabilizing the pressure in the flow channels filled with the working gas, the plasma generated by the cathode discharge apparatus of the present invention has the properties of high uniformity and high dissociation to enhance the deposition rate. Accordingly, the present invention can solve the above mentioned problem, can greatly promote the manufacturing technologies, product performance, product quality and reliability of the optoelectronic apparatus, e.g. solar cells, can reduce the production cost at the same time, and finally make great contributions to the customers. The present invention is described below.

SUMMARY OF THE INVENTION

The present invention provides the cathode discharge apparatus able to generate the plasma with high uniformity and high ionization.

In accordance with one aspect of the present invention, a cathode discharge apparatus is provided. The cathode discharge apparatus comprises an anode, a cathode and plural cathode chambers. The cathode is located inside the anode, wherein the cathode has plural flow channels and at least one flow channel hole, and the plural flow channels are connected to one another through the flow channel hole. The plural cathode chambers are located inside the cathode, wherein each of the cathode chambers has a chamber outlet and a chamber inlet connected with at least one of the flow channels.

In one embodiment, the cathode discharge apparatus further comprises an insulator separating the anode from the cathode.

In another embodiment, the cathode discharge apparatus further comprises a flow channel inlet for feeding the cathode discharge apparatus with a working gas therethrough, wherein the working gas flows into the cathode chambers through the flow channel inlet, one of the flow channels, the at least one flow channel hole, another one of the flow channels and the chamber inlets, sequentially.

In one embodiment, the working gas is selected from a group consisting of hydrogen, helium, argon, oxygen, nitrogen, ammonia, silane, and a combination thereof.

In one embodiment the working gas inside the cathode chambers generates plasma spouted through the chamber outlets.

In one embodiment, the plasma is spouted through the chamber outlets along plural spouting directions unparallel to one another.

In one embodiment, the cathode further comprises a first and a second portions, which are made in one of one piece and separate pieces.

In one embodiment, each of the cathode chambers comprises a first and a second portions, the first portion of the cathode chamber is located inside the first portion of the cathode, and the second portion of the cathode chamber is located inside the second portion of the cathode.

In one embodiment, the first and the second portions of the cathode chambers are different in at least one of shape and size.

In one embodiment, the cathode discharge apparatus further comprises an electrical feedthrough connected with the cathode.

In accordance with another aspect of the present invention, another cathode discharge apparatus is provided. The cathode discharge apparatus comprises an anode, plural cathodes and plural electrical feedthroughs. The plural cathodes are located inside the anode, wherein each of the cathodes has at least one flow channel and at least one cathode chamber having a chamber outlet and a chamber inlet connected with the flow channel. The plural electrical feedthroughs are connected with the cathodes.

In one embodiment, the cathode discharge apparatus further comprises a power supply electrically connected with at least one of the electrical feedthroughs.

In one embodiment, the cathode discharge apparatus further comprises at least one flow channel inlet for feeding the cathode discharge apparatus with a working gas therethrough, wherein the working gas flows into the at least one cathode chamber through the flow channel inlet, the flow channel and the chamber inlet, sequentially.

In one embodiment the working gas inside the cathode chamber generates plasma spouted through the chamber outlet.

In accordance with a further aspect of the present invention, a cathode discharge apparatus is provided. The cathode discharge apparatus comprises plural cathode discharge units and an electrode connecting element. Each of the plural cathode discharge units comprises an anode, an insulator, a cathode, plural cathode chambers and plural electrical feedthroughs. The cathode is located inside the anode, wherein the anode and the cathode are separated by the insulator, and the cathode has at least one flow channel internally. The plural cathode chambers are located inside the cathode, wherein each of the cathode chambers has a chamber outlet and a chamber inlet connected with the flow channel. The plural electrical feedthroughs are connected with the cathode. The electrode connecting element is electrically connected with at least one of the electrical feedthroughs.

In one embodiment, the at least one flow channel comprises a first flow channel, a second flow channel and at least one flow channel hole communicating the first and the second flow channels.

In one embodiment, the cathode discharge apparatus further comprises at least one flow channel inlet for feeding the cathode discharge apparatus with a working gas therethrough, wherein the working gas flows into the cathode chambers through the first flow channel, the flow channel hole, the second flow channel and the chamber inlets, sequentially.

In one embodiment, the working gas is selected from a group consisting of hydrogen, helium, argon, oxygen, nitrogen, ammonia, silane, and a combination thereof.

In one embodiment, plasma is generated by the working gas inside the cathode chambers, and the plasma is spouted through the chamber outlets.

In one embodiment, the cathode discharge apparatus further comprises a power supply electrically connected to the electrode connecting element, wherein the power supply provides power to the cathode through the electrode connecting element and the electrical feedthroughs.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of several embodiments of this invention are presented herein for the purposes of illustration and description only; it is not intended to be exhaustive or to be limited to the precise form disclosed.

First Embodiment

Figure 1:
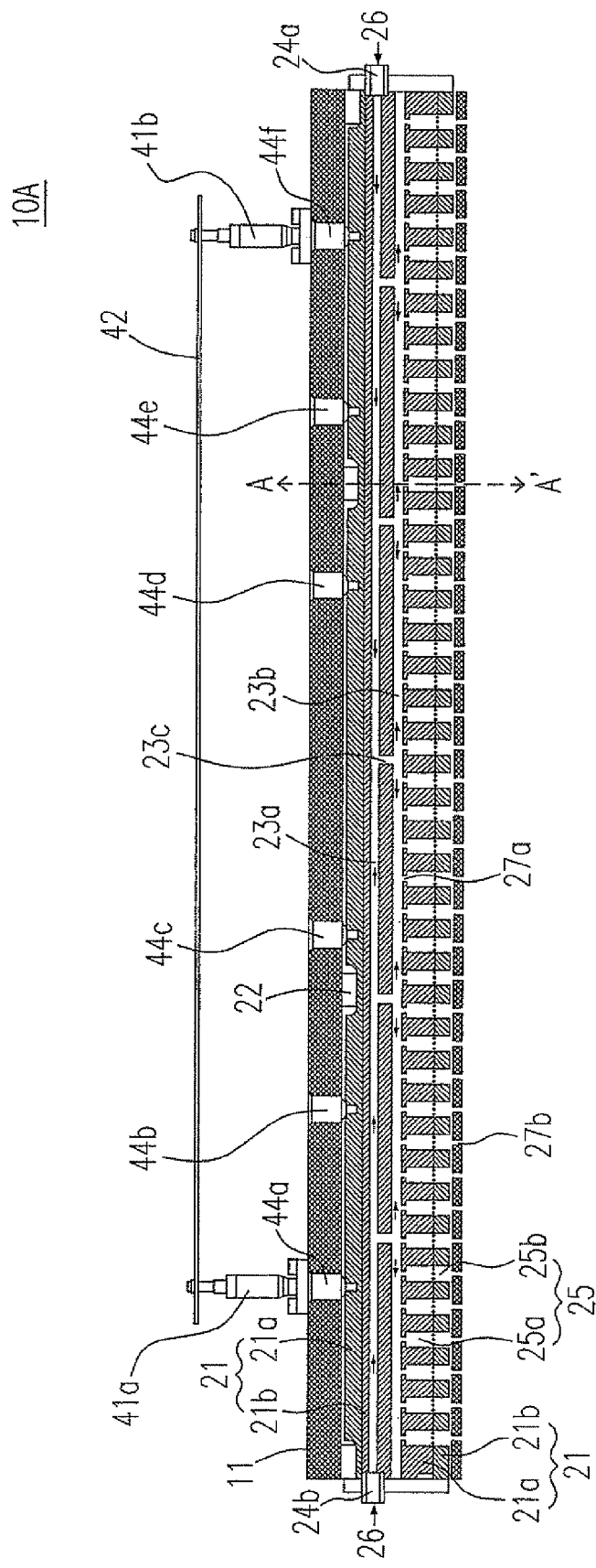
FIG. 1 is the schematic diagram showing the cross section of the cathode discharge apparatus from the side view according to the first embodiment of the present invention.
Figure 2:
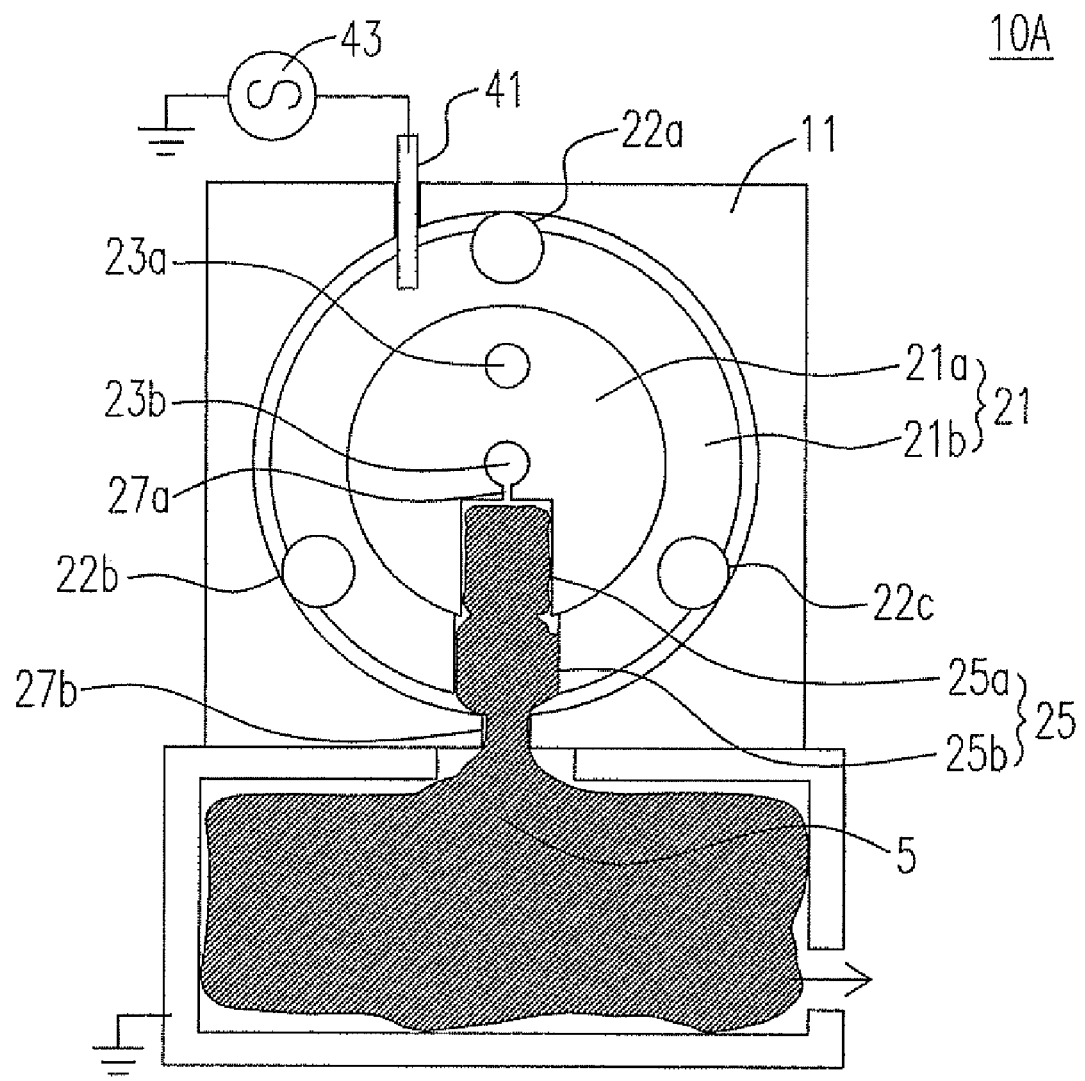
FIG. 2 is the schematic diagram showing the cross section of the cathode discharge apparatus in FIG. 1 along the A-A' line according to the first embodiment of the present invention.

FIG. 1 is the schematic diagram showing the cross section of the cathode discharge apparatus from the side view according to the first embodiment of the present invention. FIG. 2 is the schematic diagram showing the cross section of the cathode discharge apparatus in FIG. 1 along the A-A line according to the first embodiment of the present invention. Please refer to FIG. 2. The cathode discharge apparatus 10A includes the anode 11, the cathode 21 and the cathode chamber 25. The cathode 21 is located inside the anode 11. The insulators 22a, 22b and 22c separate the cathode 21 and anode 11.

The cathode 21 includes plural cathode chambers 25, and can be divided into the first portion 21a and the second portion 21b, which may be two pieces contacted with each other for facilitating the machining process, or may be made in one piece. Each of the cathode chambers 25 can be divided into the first portion 25a and the second portion 25b, where the first portion 25a of the cathode chamber 25 is located in the first portion 21a of the cathode 21, and the second portion 25b of the cathode chamber 25 is located in the second portion 21b of the cathode 21.

Please refer to FIGS. 1 and 2. Inside the first portion 21 a of the cathode 21, there are the first flow channel 23a, the second flow channel 23b, the flow channel holes 23c, the first portion 25a of the cathode chamber 25 and the chamber inlet 27a. The chamber outlet 27b is located inside the anode 11 and below the second portion 25b of the cathode chamber 25.

Please refer to FIG. 2. The cathode discharge apparatus 10A may include the electrical feedthrough 41 and the power supply 43. The electrical feedthrough 41 is electrically connected with the cathode 21. The power supply 43 provides power to the cathode 21 via the electrical feedthrough 41.

It can be seen in FIG. 1 that the cathode 21 and the anode 11 are separated by several insulators 22. The cathode discharge apparatus 10A may include the electrical feedthroughs 41a and 41b, several vacuum sockets 44a-f plugged with the electrical feedthroughs 41a and 41b, and the electrode connecting element 42. The power supply 43 in FIG. 2 (not shown in the FIG. 1) is electrically connected with the electrode connecting element 42, and can provide power to the cathode 21 via the electrode connecting element 42 and the electrical feedthroughs 41a and 41b.

Please refer to FIG. 1 again. The working gas 26 is fed into the first flow channel 23a via the flow channel inlets 24a and 24b in two ends, and flows successively through several flow channel holes 23c, the second flow channel 23b and the chamber inlets 27a into the cathode chambers 25. The working gas 26 inside the cathode chambers 25 can be ionized to generate the plasma 5 (shown in FIG. 2, not in FIG. 1), which is injected through the chamber outlets 27b.

The first portion 25a and the second portion 25b of the cathode chamber 25 can be designed to have the shapes of cylinder, cone, cuboid and pyramid. In this embodiment, the cylinder shape is chosen. The cross section area of the second portion 25b of the cathode chamber 25 can be larger than that of the first portion 25a of the cathode chamber 25. Therefore, the plasma will be expanded when flowing into the second portion 25b of the cathode chamber 25, and will be injected through the chamber outlet 27b. On the other hand, the cross section areas of these two portions can be equal.

The first flow channel 23a and the second flow channel 23b can be designed to be parallel or unparallel to each other. The working gas is usually selected from a group consisting of hydrogen, helium, argon, oxygen, nitrogen, ammonia and silane, based on the desired coating material. For instance, the ammonia and the silane are chosen when the desired coating material is silicon nitride; the silane is chosen when the desired coating material is silicon. The argon is inert gas, can not be reacted with other material easily, and can be used to generate the plasma.

Although the working gas 26 is fed via the flow channel inlets 24a and 24b in the two ends, the pressure in the second flow channel 23b can be evenly distributed. Due to the design of the first flow channel 23a, the second flow channel 23b and the flow channel holes 23c in this embodiment, the working gas 26 will flow into the second flow channel 23b via the flow channel holes 23c after the working gas 26 has saturated the first flow channel 23a. The working gas pressure is uniformly distributed in any portion of the second flow channel 23b owing to the design of the distributed flow channel holes 23c.

In the conventional technique, there is only one flow channel. Thus, the gas pressure in the portions of the flow channel close to he flow channel inlets in the two ends will be much higher than that in the center portion of the flow channel. Accordingly, the working gas pressure inside the cathode chambers 25 close to two ends will be much higher than that inside the cathode chambers 25 located in the center portion. The working gas pressure inside the cathode chambers has the strong influence on the plasma density, which in turn would strongly affect the thickness and the density of the coating film. In the conventional technique, the variation of the plasma density along the whole tier of cathode chambers is quite large, especially when the tubular cathode is quite long and quantity of the cathode chambers is very large for large area deposition. That is to say, the uniformity problem of the plasma density becomes quite serious for the large area deposition by using the conventional techniques.

In this embodiment, the working gas pressure in any portion of the second flow channel 23b is evenly distributed due to the design of the first flow channel 23a, the second flow channel 23b and the flow channel holes 23c. Accordingly, the working gas pressure in each of cathode chambers 25 is almost equal, so the uniformity of the plasma density can be greatly improved to solve the problem of the conventional technique, and thus the present invention can successfully conquer the technical bottleneck of the large area deposition.

Second Embodiment

Figure 3:
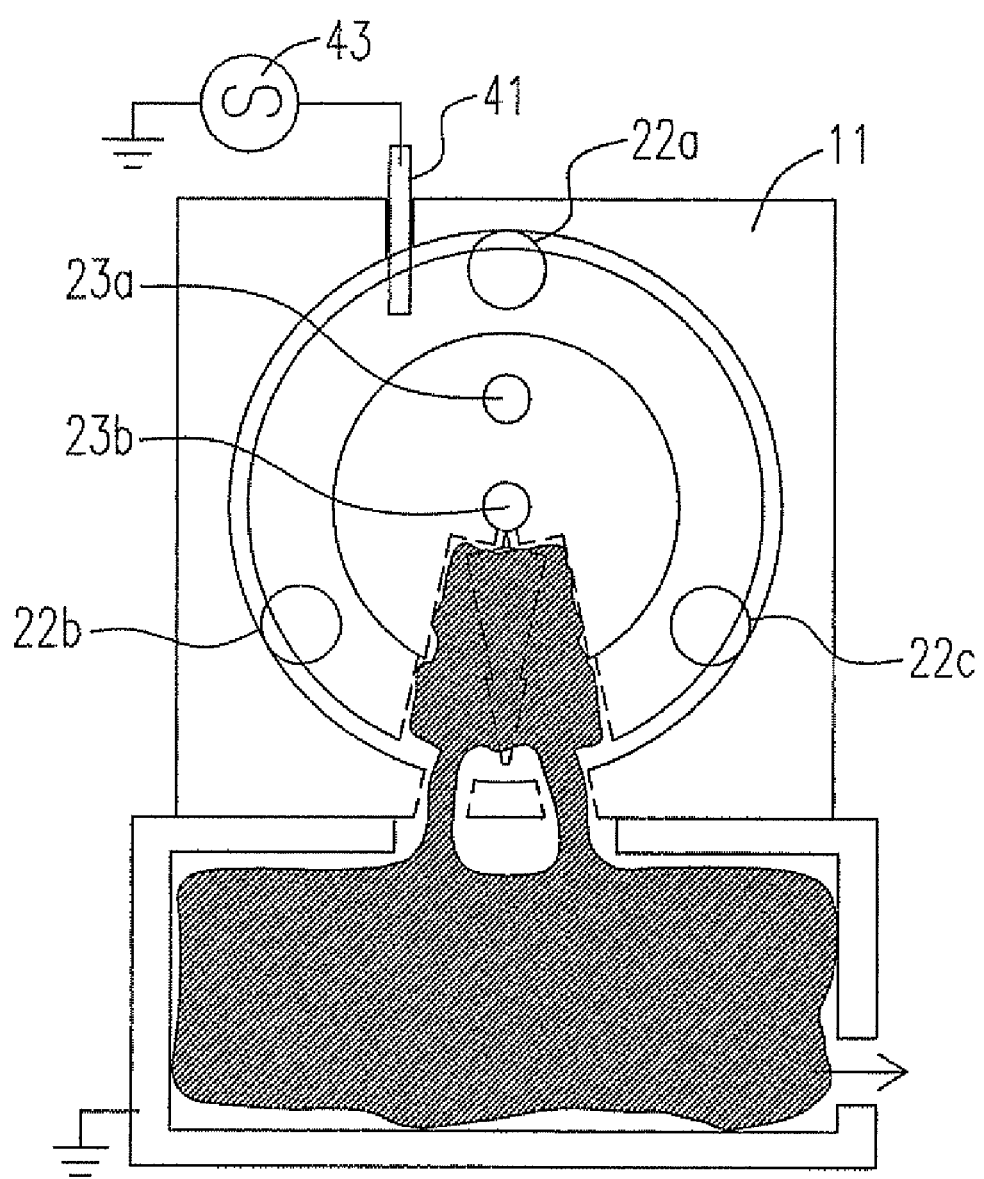
FIG. 3 is the schematic diagram showing the cross section of the cathode discharge apparatus according to the second embodiment of the present invention.

The cathode discharge apparatus of the present embodiment is almost identical to that in the first embodiment. The only difference between the present embodiment and the first embodiment is: in the first embodiment, the cathode chambers 25 are designed to be parallel to one another and are oriented vertically downward, so the plasma is injected vertically downward via the chamber outlets 27b; while in the present embodiment, the cathode chambers 25 are designed to tilt at an angle relative to the vertical direction. The FIG. 3 is the schematic diagram showing the cross section of the cathode discharge apparatus according to the second embodiment of the present invention. The difference between the present embodiment and the first embodiment can be told by referring to FIGS. 2 and 3 simultaneously. The cathode chambers of the present embodiment tilts at a small angle, e.g. 5-30 degree, relative to the vertical direction, and can be aligned in a way, where the odd-numbered cathode chambers tilt counterclockwise at a small angle, e.g. −12 degree; while the even-numbered cathode chambers tilt clockwise at a small angle, e.g. +12 degree. This design of the present embodiment can expand the injected area by the plasma.

Third Embodiment

Figure 4:
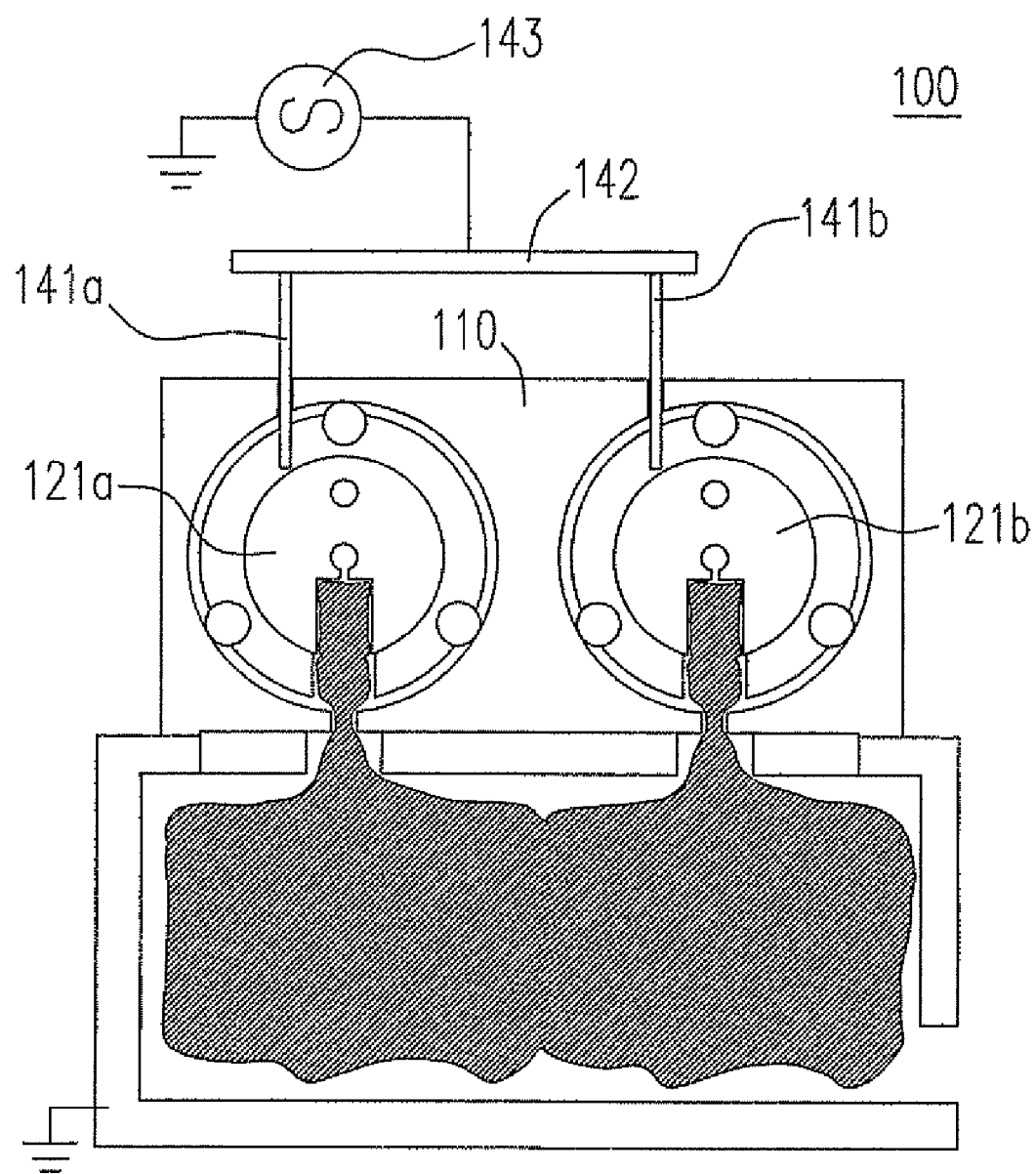
FIG. 4 is the schematic diagram showing the cross section of the cathode discharge apparatus according to the third embodiment of the present invention.

Please refer to FIG. 4, which is the schematic diagram showing the cross section of the cathode discharge apparatus according to the third embodiment of the present invention. In this embodiment, the cathode discharge apparatus 100 includes an anode 110 and two cathodes 121a and 121b, where the structure of each cathode is almost the same as that of the first embodiment. That is to say, two parallel aligned tubular cathodes 121a and 121b are enclosed inside the anode 110, and share the single anode 110. The two cathodes 121a and 121b have the electrical feedthroughs 141a and 141b, respectively. The cathode discharge apparatus 100 can contain the electrode connecting element 142 and the power supply 143, both of which are electrically connected, and the power supply 143 can provide power to the cathodes 121a and 121b through the electrode connecting element 142 and the electrical feedthroughs 141a and 141b.

Figure 5:
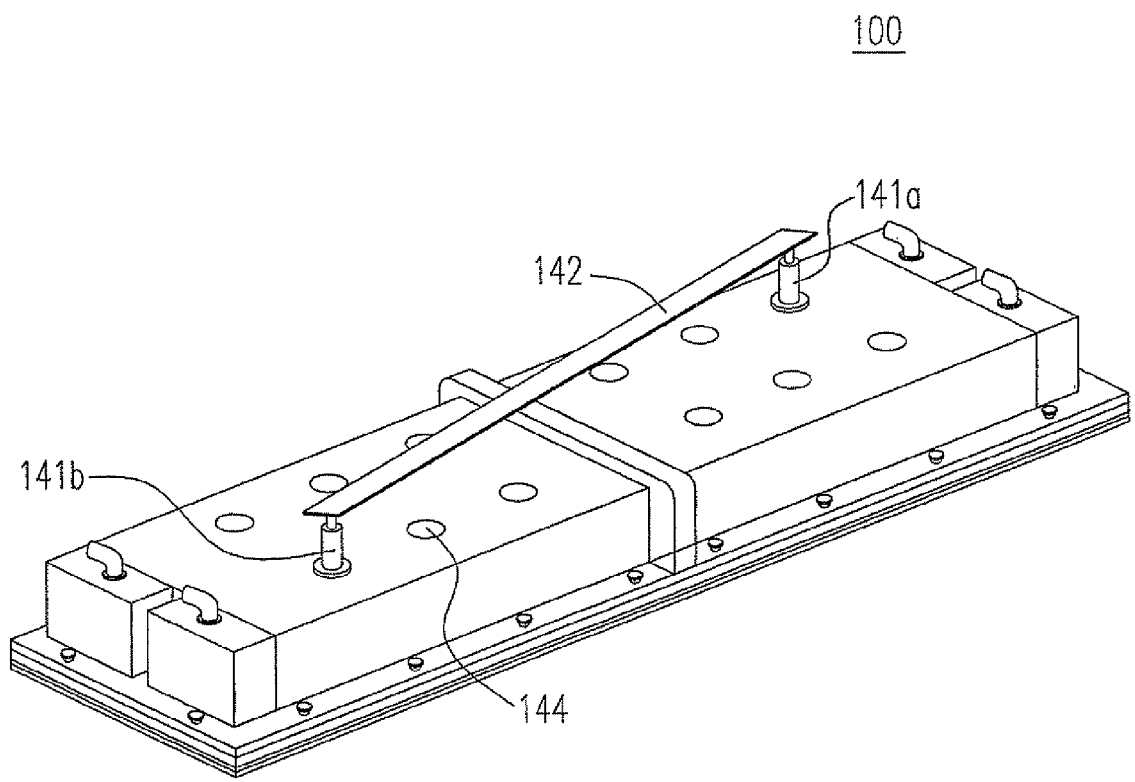
FIG. 5 is the schematic diagram showing the 3-dimensinal view of the cathode discharge apparatus according to the third embodiment of the present invention.

FIG. 5 is the schematic diagram showing the 3-dimensinal view of the cathode discharge apparatus according to the third embodiment of the present invention. General speaking, the portion of the cathode close to the power input point, i.e. the position of the electrical feedthroughs, have the higher received power than the portion of the cathode far away from the power input point. Please refer to FIG. 5. In this embodiment, the electrical feedthrough 141a is located close to one end of the cathode 121a, which is not shown in FIG. 5, and the electrical feedthrough 141b is located close to the opposite end of the cathode 121b, which is not shown in FIG. 5.

Since the electrical feedthroughs 141a and 141b are located close to two ends of the cathodes 121a and 121b, the power density can be well balanced through the two cathodes 121a and 121b, and the uniformity of the plasma can be well improved, especially for the large area coating. The cathode discharge apparatus 100 in FIG. 5 can further contain several vacuum sockets 144, which positions can be adjusted according to the practical necessity so as to reach the optimum uniformity of the power distribution by taking the consideration of the influence of the input power quantity on the power distribution.

Fourth Embodiment

Figure 6:
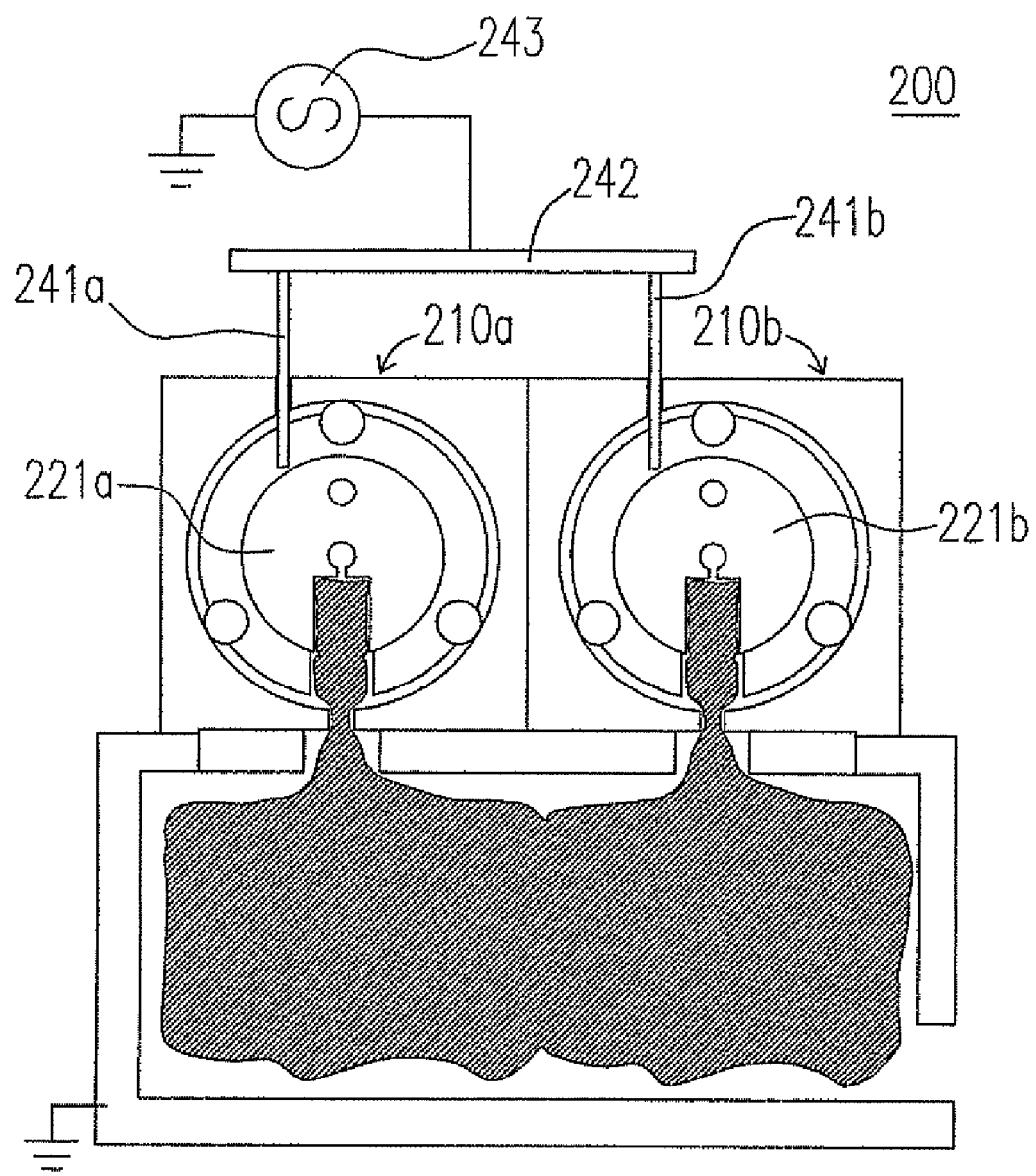
FIG. 6 is the schematic diagram showing the cross section of the cathode discharge apparatus according to the fourth embodiment of the present invention.

Please refer to FIG. 6, which is the schematic diagram showing the cross section of the cathode discharge apparatus according to the fourth embodiment of the present invention. In this embodiment, the cathode discharge apparatus 200 includes two cathode discharge units 210a and 210b, each of which has almost the same structure as that of the cathode discharge apparatus 10A in the first embodiment. That is to say, it looks like that two cathode discharge apparatuses 10A are aligned in parallel. The two cathode discharge units 210a and 210b have the electrical feedthroughs 241a and 241b, respectively. The cathode discharge apparatus 200 contains the electrode connecting element 242 and the power supply 243, both of which are electrically connected, and the power supply 243 can provide the power to the cathodes of the cathode discharge units 210a and 210b through the electrode connecting element 242 and the electrical feedthroughs 241a and 241b.

Figure 7:
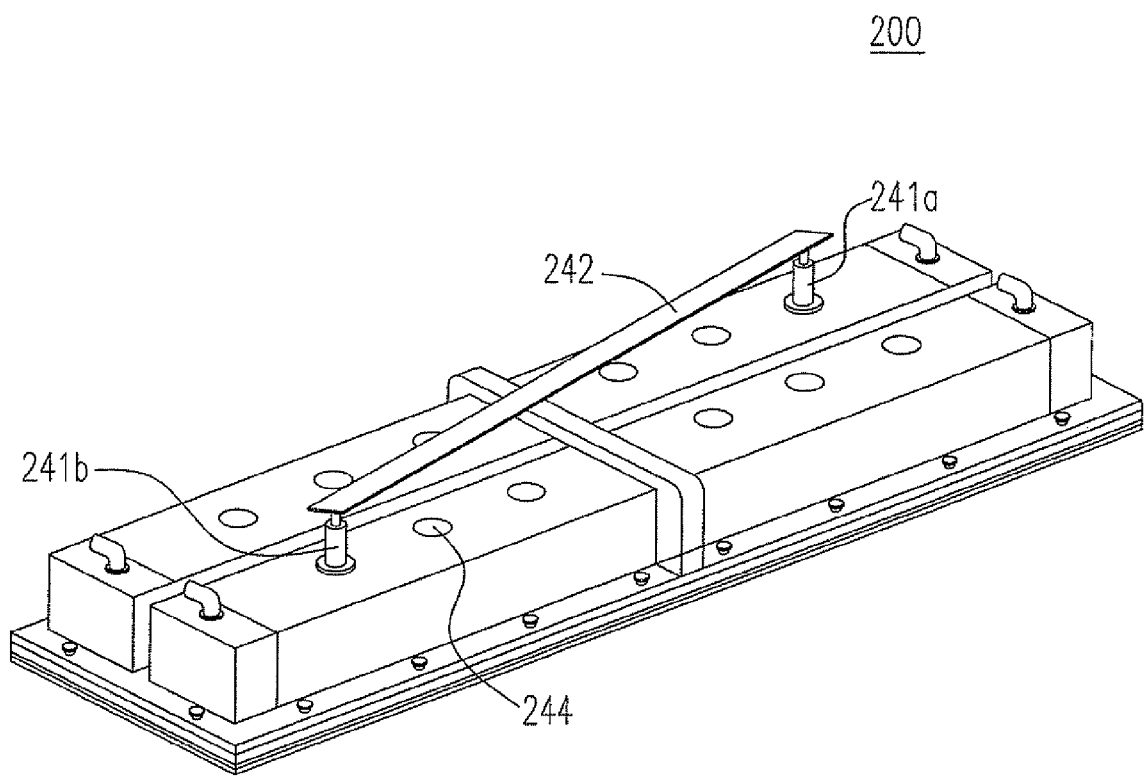
FIG. 7 is the schematic diagram showing the 3-dimensional view of the cathode discharge apparatus according to the fourth embodiment of the present invention.

FIG. 7 is the schematic diagram showing the 3-dimensinal view of the cathode discharge apparatus according to the fourth embodiment of the present invention. General speaking, the portion of the cathode close to the power input point, i.e. the position of the electrical feedthrough, has the higher received power than the portion of the cathode far away from the power input point. Please refer to FIG. 7. In this embodiment, the electrical feedthrough 241a is located close to one end of the cathode discharge unit 210a, which is not shown in FIG. 7, and the electrical feedthrough 241b is located close to the opposite end of the cathode discharge unit 210b, which is not shown in FIG. 7.

Since the electrical feedthroughs 241a and 241b are located close to two ends of the cathode discharge units 210a and 210b, the power density can be well balanced through the two cathode discharge units 210a and 210b, and the uniformity of the plasma can be well improved, especially for the large area coating. The cathode discharge apparatus 200 in FIG. 7 can further contain several feedthrough sockets 244, which positions can be adjusted according to the practical necessity so as to reach the optimum uniformity of the electrical power distribution.

To sum up, the new cathode discharge apparatus with the novel technical concept and design in the present invention can provide the uniform power to each portion of the cathode, and can provide the working gas with the uniform pressure in each of cathode chamber so as to reach the uniform distribution of the whole plasma. Therefore, the problem of the poor plasma distribution for the large area coating in the current technologies can be solved, and the technical bottleneck for the large area coating can be successfully conquered. The present invention can contribute the great benefits for those industries hungering for the large area coating technology, e.g. the industries of liquid crystal displays, solar cells, etc., and can farther make great contributions to the environmental conservation.

While the invention has been described in terms of what is presently considered to be the most practical embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A cathode discharge apparatus, comprising:
a flow channel inlet for feeding a working gas therethrough;
an anode;
a cathode located inside the anode, with the cathode including a plurality of flow channels and at least one flow channel hole, and with the plurality of flow channels being connected to one another through the at least one flow channel hole; and
a plurality of cathode chambers located inside the cathode, with each cathode chamber having a chamber outlet and a chamber inlet connected with the at least one flow channel,
wherein the working gas flows into the plurality of cathode chambers through the flow channel inlet, one of the flow channels, the at least one flow channel hole, another one of the flow channels and the chamber inlets, sequentially.

2. A cathode discharge apparatus of claim 1, further comprising an insulator separating the anode from the cathode.

3. A cathode discharge apparatus of claim 1, wherein the working gas is selected from a group consisting of hydrogen, helium, argon, oxygen, nitrogen, ammonia, silane and a combination thereof.

4. A cathode discharge apparatus of claim 1, wherein the working gas inside the cathode chambers generates plasma spouted through the chamber outlets.

5. A cathode discharge apparatus of claim 4, wherein the plasma is spouted through the chamber outlets along plural spouting directions unparallel to one another.

6. A cathode discharge apparatus of claim 1, wherein the cathode further comprises a first cathode portion and a second cathode portion, with the first cathode portion being formed as a single piece and with the second cathode portion being formed as separate pieces.

7. A cathode discharge apparatus of claim 6, wherein each of the cathode chambers comprises a first portion of the cathode chamber and a second portion of the cathode chamber, with the first portion of the cathode chamber being located inside the first cathode portion, and with the second portion of the cathode chamber being is located inside the second cathode portion.

8. A cathode discharge apparatus of claim 7, wherein the first and the second portions of the cathode chambers are different in at least one of shape and size.

9. A cathode discharge apparatus of claim 1, further comprising an electrical feedthrough connected with the cathode.

10. A cathode discharge apparatus, comprising:
an anode;
a first and a second cathode located inside the anode, with each of the first and second cathodes having a longitudinal direction and at least one flow channel and at least one cathode chamber having a chamber outlet and a chamber inlet connected with the flow channel,
wherein the first and the second cathodes are aligned to be parallel to each other, each of the first and the second cathodes includes first and second parts disposed along the respective longitudinal direction, and the first part of the first cathode is nearer to the first part of the second cathode than to the second part of the second cathode;
a first electrical feedthrough connected with the first part of the first cathode; and
a second electrical feedthrough connected with the second part of the second cathode.

11. A cathode discharge apparatus of claim 10, further comprising a power supply electrically connected with at least one of the first and second electrical feedthroughs.

12. A cathode discharge apparatus of claim 10, further comprising at least one flow channel inlet for feeding the cathode discharge apparatus with a working gas therethrough, wherein the working gas flows into the at least one cathode chamber through the flow channel inlet, the flow channel and the chamber inlet, sequentially.

13. A cathode discharge apparatus of claim 12, wherein the working gas inside the cathode chamber generates plasma spouted through the chamber outlet.

14. A cathode discharge apparatus, comprising:
a first and a second cathode discharge unit, each having a longitudinal direction and comprising
an anode,
an insulator,
a cathode located inside the anode, with the anode and the cathode being separated by the insulator, and the cathode having at least one flow channel internally,
a plurality of cathode chambers located inside the cathode, with each cathode chamber having a chamber outlet and a chamber inlet connected with the flow channel, and
an electrical feedthrough connected with the cathode; and
an electrode connecting element electrically connected with the respective electrical feedthroughs of the first and the second cathode discharge units,
wherein the first and the second cathode discharge units are aligned to be parallel to each other, each of the first and the second cathode discharge units including first and second parts disposed along the respective longitudinal direction, with the first part of the first cathode discharge unit being nearer to the first part of the second cathode discharge unit than to the second part of the second cathode discharge unit, with the electrical feedthrough of the first cathode discharge unit being disposed in the first part of the first cathode discharge unit, and the electrical feedthrough of the second cathode discharge unit being disposed in the second part of the second cathode discharge unit.

15. A cathode discharge apparatus of claim 14, wherein the at least one flow channel includes a first flow channel, a second flow channel and at least one flow channel hole communicating with the first and the second flow channels.

16. A cathode discharge apparatus of claim 15, further comprising at least one flow channel inlet for feeding the cathode discharge apparatus with a working gas therethrough, wherein the working gas flows into the cathode chambers through the first flow channel, the flow channel hole, the second flow channel and the chamber inlets, sequentially.

17. A cathode discharge apparatus of claim 16, wherein the working gas comprises at least one selected from a group consisting of hydrogen, helium, argon, oxygen, nitrogen, ammonia and silane.

18. A cathode discharge apparatus of claim 16, wherein plasma is generated by the working gas inside the cathode chambers, and the plasma is spouted through the chamber outlets.

19. A cathode discharge apparatus of claim 14, further comprising a power supply electrically connected to the electrode connecting element, wherein the power supply provides power to the cathode through the electrode connecting element and the plurality of electrical feedthroughs.

* * * * *